United States Patent

Hargy, III

[11] Patent Number: 5,986,892
[45] Date of Patent: Nov. 16, 1999

[54] MOUNT FOR A CIRCUIT BOARD INCLUDING A MOUNTING BRACKET AND RECEPTOR FOR THE BRACKET

[76] Inventor: John J. Hargy, III, 201 Calle Potzanca, San Clemente, Calif. 92672

[21] Appl. No.: 09/072,153

[22] Filed: May 4, 1998

Related U.S. Application Data

[60] Provisional application No. 60/054,929, Aug. 8, 1997.

[51] Int. Cl.[6] .................................................... H05K 7/14
[52] U.S. Cl. ...................... 361/759; 361/799; 361/825; 174/51; 248/223.31; 211/41.17
[58] Field of Search ..................................... 361/759, 748, 361/752, 796, 797, 799, 800, 801, 816, 818, 825; 174/51; 24/456, 457; 248/223.31, 224.7, 225.21; 211/41.17

[56] References Cited

U.S. PATENT DOCUMENTS

| | | | |
|---|---|---|---|
| 4,477,135 | 10/1984 | Pronto | 211/41.17 X |
| 4,974,798 | 12/1990 | Harding et al. | 248/224.7 X |
| 5,218,519 | 6/1993 | Welch et al. | 361/801 |
| 5,343,361 | 8/1994 | Rudy, Jr. et al. | 361/799 X |
| 5,754,404 | 5/1998 | Biermann et al. | 361/737 |

FOREIGN PATENT DOCUMENTS

WO 87/05776   9/1987   WIPO .

*Primary Examiner*—Donald Sparks
*Assistant Examiner*—Jayprakash N. Gandhi
*Attorney, Agent, or Firm*—Thomas P. Mahoney

[57] ABSTRACT

A mount for a circuit board includes a mounting bracket having an elongated shank which has tab incorporating detents. Receptors incorporate receptacles for the reception of the tabs and have latches engagable in the detents to locate the tabs in the receptacles. The bracket and receptors are electrically conductive to ground the circuit board and the bracket and receptors can be secured to the circuit board by automatic installation machinery.

16 Claims, 5 Drawing Sheets

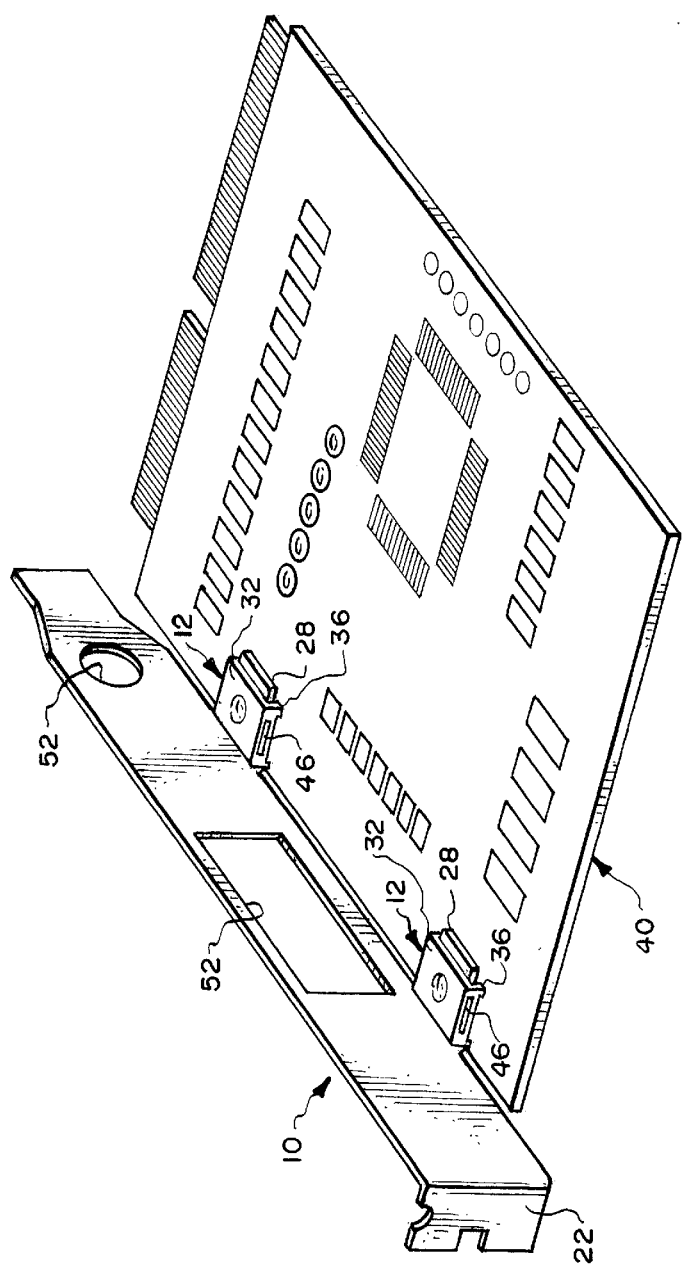
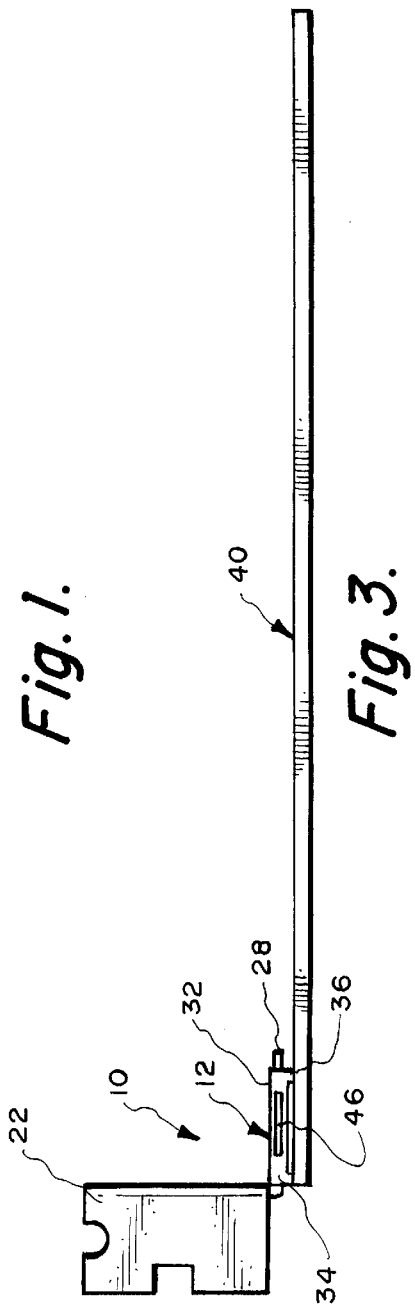

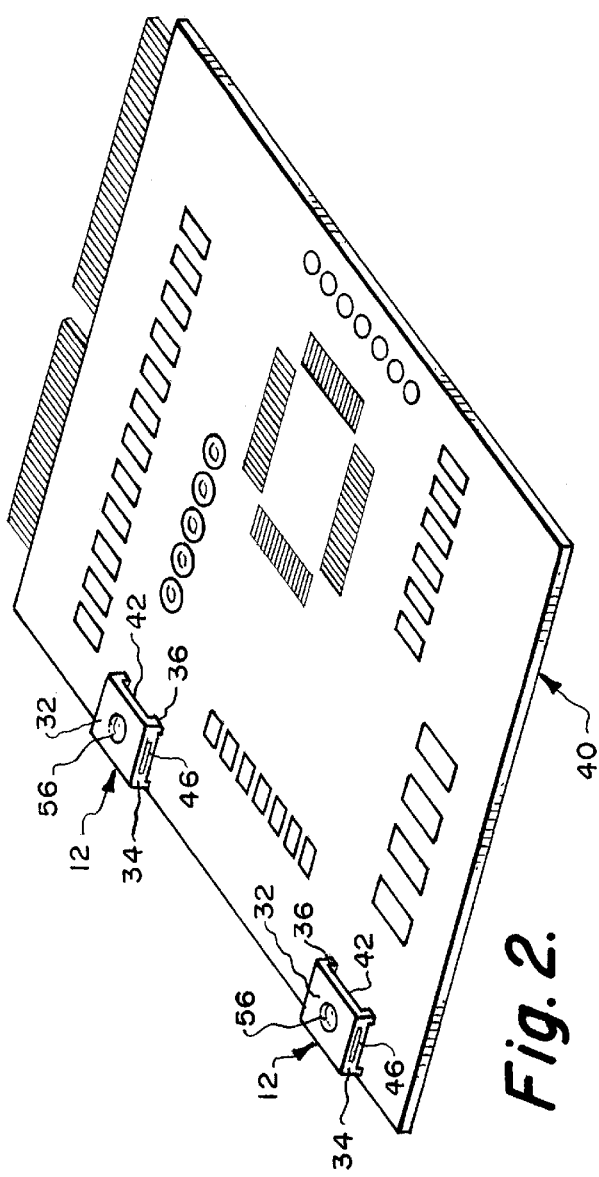
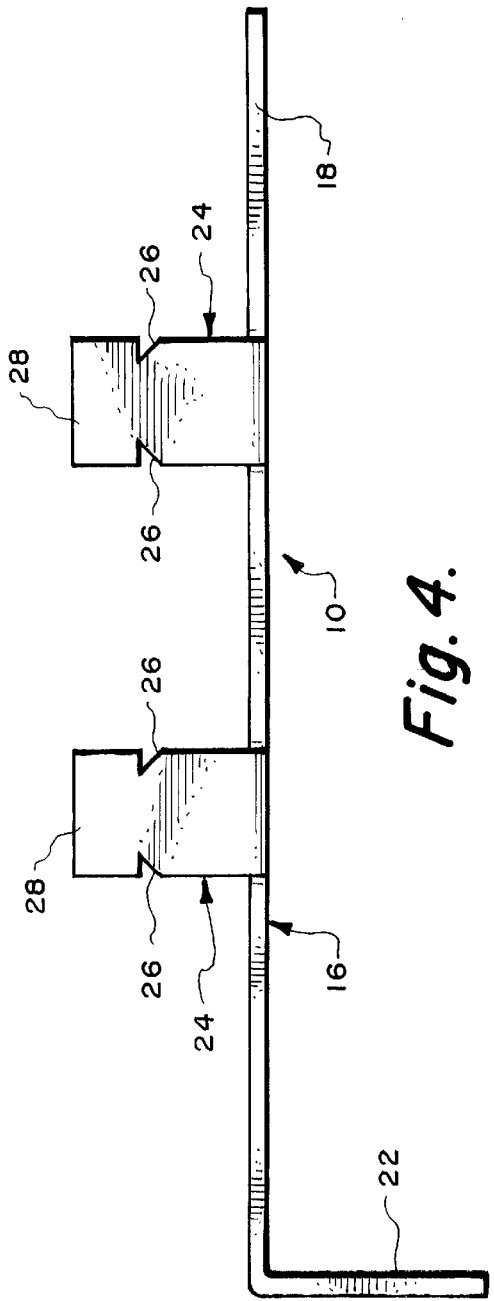

MOUNT FOR A CIRCUIT BOARD INCLUDING A MOUNTING BRACKET AND RECEPTOR FOR THE BRACKET

This application claims the benefit of U.S. Provisional Application No. 60/054,929, filed Aug. 8, 1997.

This invention relates to circuit board mounts and, more particularly, to a circuit board mount which will permit the robotic assembly of the circuit board bracket with the board.

BACKGROUND OF THE INVENTION

In recent years, the circuit board industry has produced increasing quantities of add-in boards for LAN, WAN, and communication type applications. Thus, fewer D-SUB type connectors are being utilized on the boards and modular jacks, mini-pin B and C connectors and RCA type connectors are being used.

Consequently, the mounting of the circuit boards in the mother board and within the housing has become a greater problem since present mounts for circuit boards all entail the utilization of some form of manual securement of the mounts to the boards.

Various expedients have been utilized to mount add-in and other circuit boards to the computer housing. For instance, the most prevalent practice is the utilization of a mount consisting of a bracket having right-angularly oriented tabs incorporating fastener receiving holes. The circuit board is secured to the tabs by the insertion of screws through openings in the circuit board corresponding with threaded openings in the tabs.

Alternatively, the openings in the tabs are not pre-threaded and the screws inserted through the openings are maintained in operative relationship with the circuit board and tabs by means of corresponding nuts.

Attempts have also been made to rivet circuit boards to the tabs of associated mounting brackets, but the vagaries of the riveting process have militated against the acceptance of this method due to the unpredictable cracking and other damage imposed on the boards by the riveting process.

In any event, all of these methods entail the manual assembly of the brackets with the boards and, thus, prevent the utilization of currently accepted robotic processing which is characteristic of circuit board manufacture.

OBJECTS AND ADVANTAGES OF THE INVENTION

A primary object of my invention is the provision of a circuit board mount which will permit the mounting bracket to be assembled in operative relationship with a circuit board automatically, thus dispensing with the conventional hand assembly of the bracket with the circuit board.

Another object of my invention is the provision of a circuit board mount which includes engagement means on the circuit board bracket and receptor means on the circuit board whereby the automatic insertion of the engagement means in the receptor means accomplishes the permanent mounting of the bracket on the circuit board.

An additional object of my invention is the provision of a circuit board mount wherein the aforesaid engagement means on the bracket includes one or more connector elements or tabs formed integrally with the bracket and protruding therefrom for engaging one or more receptor means on said circuit board during the automatic assembly of the bracket with the circuit board.

Another object of my invention is the provision of a circuit board mount incorporating latching means to ensure the optimum securement of the aforesaid bracket to the circuit board. The latching means performs two functions, namely: the location of the engagement means in the receptor means at the proper location and the retention of the engagement means in the receptor means.

A further object of my invention is the provision of engagement means on said bracket incorporating detent means cooperative with latching members on said receptors.

An additional object of my invention is the provision of a circuit board mount wherein the latching means provided on the female receptors are spring biased into engagement with the tab detent means resulting in the automatic engagement of the tab detent means by said latching means.

An additional object of my invention is the provision of a computer mount of the aforesaid character wherein conductor means is provided between said engagement means and said receptor to ensure the proper grounding of the circuit board through the associated mounting bracket.

A further object of my invention is the provision of a circuit board mount wherein the conductor means is incorporated in the latching means to establish a ground with said tabs when said latching means engages said detent means.

Another object of my invention is the provision of a mount for add-in printed circuit boards which can be assembled in operative relationship with the boards by the utilization of the pick-and-place equipment assembly being utilized to install components on the circuit board.

A further object of my invention is the provision of a circuit board mount incorporating receptors which can be placed on the board during the component placement sequence which permits the installation of the bracket on the receptors at the end of the assembly line.

Other objects and advantages of the invention will be apparent from the following specification and the drawings accompanying the same.

BRIEF DESCRIPTION OF THE DRAWINGS

FIG. 1 is an isometric view of the circuit board mount of the invention;

FIG. 2 is an isometric view of the receptors secured to the circuit board;

FIG. 3 is a side elevational of the mount installed on the circuit board;

FIG. 4 is a top plan view showing the bracket engagement means detents;

PREFERRED EMBODIMENT OF THE INVENTION

Figure 5:
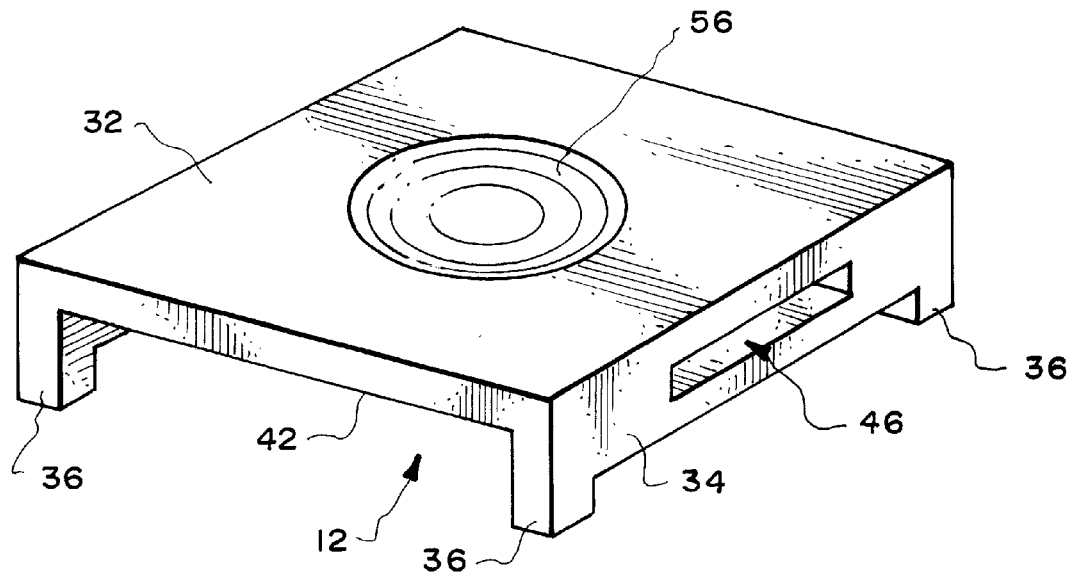
FIG. 5 is an isometric top view showing one of the receptors.

Referring to the drawings, and particularly to FIGS. 1–4 thereof, I show the components of a circuit board mount which consists of a bracket 10 and a pair of receptors 12. The bracket 10 is fabricated from cold-rolled steel which is nickel-plated after the completion of the bracket by various well-known stamping procedures.

The body 16 of the bracket 10 includes an elongated shank 18 having a right-angularly oriented head 22 formed integrally therewith. The shank 18 and head 22 are common configurations of presently utilized circuit board brackets and are installable in a computer chassis, not shown, to create a ground between the circuit board and the chassis.

Formed integrally with an edge of the shank 18 is a pair of engagement means or tabs 24, said tabs having detent means or notches 26 provided in the opposite edges thereof for a purpose which will be described in greater detail below. The tabs 24 have entry heads 28 which are adapted to cooperate with and facilitate the entry of the tabs into mounting engagement with the receptors 12 of FIGS. 2 and 3.

Figure 6:
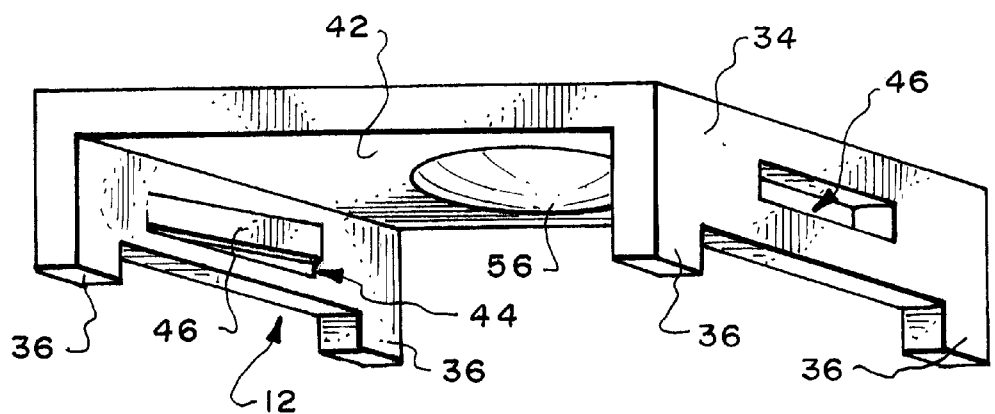
FIG. 6 is an isometric bottom view of the receptor of FIG. 5.

The receptors 12, as best shown in FIGS. 5 and 6, are formed from cold rolled steel stampings which are subsequently nickel-plated and essentially include an upper or top wall 32 and depending side walls 34, the side walls 34 having attachment feet 36 which facilitate the securement of the receptors in operative relationship with the circuit board 40, in a manner to be described in greater detail below. The top wall 32 and depending side walls 34 define a receptacle cavity 42 when the receptor 12 is operatively associated with the circuit board 40.

Latching means 44 is provided on the receptors 12 by punching slots 46 in the side walls 34 to form latching tongues 48, as best shown in FIG. 6, which snap into the detent notches 26 formed in the tabs 24 to lock the circuit board 40 to the bracket 10 and to accurately position the circuit board 40 on the bracket 10.

At this juncture, it should be noted that the bracket 10 incorporates various ports 52 for the location of sockets, conductors, or other inputs or outputs to or from the circuit board 40.

Although I have shown and described the components of the circuit board mount as including brackets having particular forms of engagement means receivable in corresponding receptors, it will be understood by those skilled in the art that various types of receptors and various configurations of tabs may be utilized to achieve the desired result. For instance, a tongue and groove relationship between tab and receptor would function in a manner analogous to the functioning of the presently disclosed tabs and receptors.

The securement of the receptors 12 to the circuit board 40 is shown in FIG. 3 of the drawings wherein the lower edges of the depending side walls 34 of the receptors 12 impinge upon the upper surface of the circuit board 40 and the depending legs 36 are engaged in openings, not shown, through the circuit board 40. The securement of the receptors 24 to the circuit board can be accomplished by such means as soldering or the like during the robotic pick-and-placement of the various components of the circuit board, thus eliminating manual assembly of the receptors 12 upon the board 40.

At the end of the assembly line, the tabs 24 are registered with the corresponding receptacles 42 defined between the upper surface of the circuit board 40 and the under surface of the top wall 32 as shown at 42. The tabs 24 are urged into the recesses 42 and the heads 28 thereof deflect the spring tongues 48 of the latching means 44, thus permitting the passage of the heads 28 to the position shown in FIG. 1 of the drawings wherein they protrude from the recesses 42.

When the heads 28 are located in the positions shown in FIG. 1, the tongues 48 spring into the detent notches 26 and lock the tabs 24 against dislocation from the receptors 12. In addition, the snapping of the tongues 48 into the detents 26 ensures the proper location of the tabs 24 with reference to the circuit board 40 ensuring that the ground between the circuit board and the bracket will be achieved and maintained.

To facilitate the maintenance of the ground, each of the receptors 12 incorporates a concave recess 56, best shown in FIGS. 5–6 of the drawings, which impinges on the respective tab 24 located beneath it to ensure that the maintenance of the ground will persist during the securement of the circuit board 40 to the bracket 10.

Shown in FIGS. 7–11 of the drawings is an alternative embodiment of the mount of FIGS. 1–6 of the drawings wherein the mounts are essentially similar in construction and mode of operation but have additional features distinguishing the mount of FIGS. 7–11 from that of the previously described mount.

The circuit board mount of FIGS. 7–11 includes a bracket 60 and a pair of receptors 62, which are mounted on a circuit board 64 in the same manner as in the previously discussed embodiment of the invention. Mounting tabs 66 are provided on the bracket 60 and have entry heads 68 which facilitate the introduction of the tab 66 into operative engagement with the receptors 62. Detent means 72 is provided in the tabs 66 in the form of openings 74 with the leading edge 76 of the opening 74 serving as the detent portion of the detent means.

The receptors 62 are stamped from cold, rolled steel and are, subsequently, nickel-plated. The receptors 62 include an upper or top wall 82 and depending side walls 84 having bifurcated attachment feet 86. The attachment feet 86 incorporate bifurcated legs 88 which have retention protrusions 92 thereupon.

The top wall 82 and depending side walls 84 define a receptor cavity 94 when the receptor 62 is mounted in operative relationship with a circuit board 64 in a manner to be described in greater detail below.

Latching means 104 is provided on the receptor 62 and includes a latching tongue 106 punched out of the top wall 82 and being spring-biased downwardly into the receptor cavity 94.

When the tabs 66 are inserted into the receptor cavity 94, the ends 68 of the tabs displace the latching tongues 106 of the receptors 66 upwardly until the leading edges 76 of the detent means 72 of the tabs 66 register with the corresponding free edges of the tongues 106 which are then urged downwardly by the spring action thereof to engage said leading edges 76 and lock the tabs 66 in the cavities 94 of the receptors 62.

Figure 7:
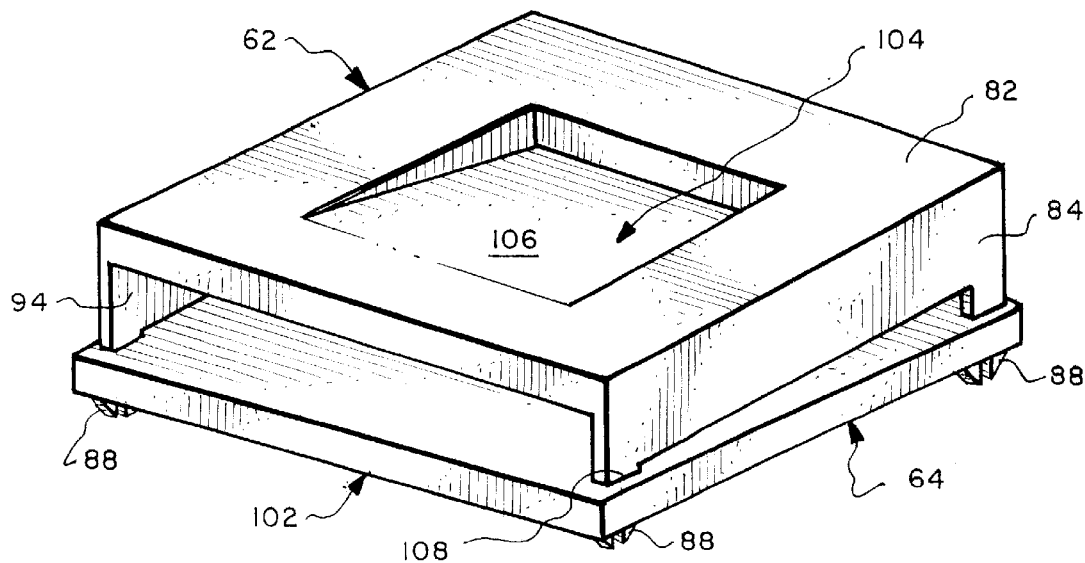
FIG. 7 shows an alternative embodiment of the receptor.
Figure 8:
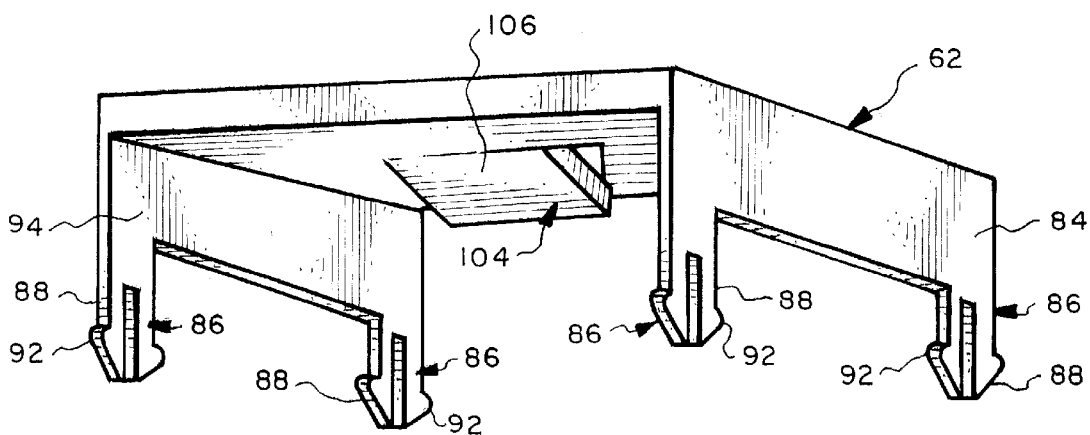
FIG. 8 shows the receptor of FIG. 7 prior to installation on a circuit board.
Figure 9:
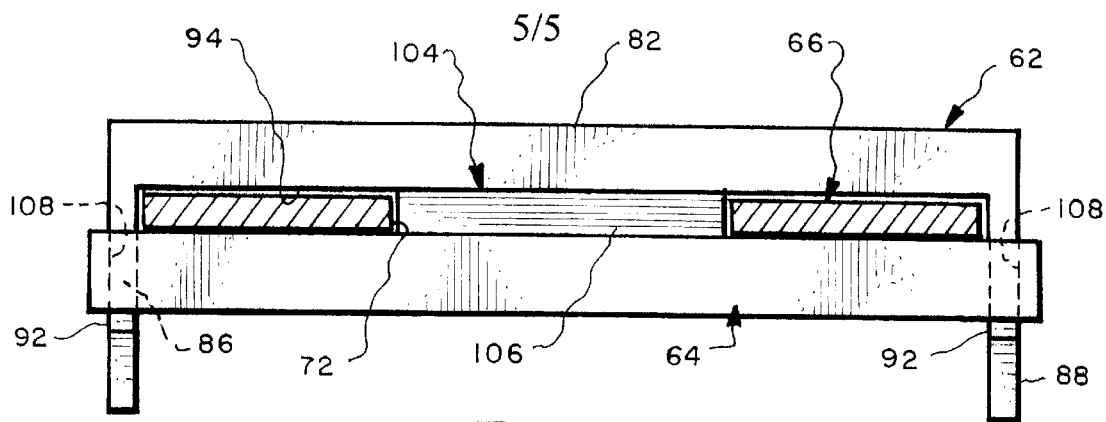
FIG. 9 illustrates the mounting of the receptor on a circuit board with the bracket tab detent means engaged by the latching means to maintain the tab in operative relationship with the receptor.
Figure 10:
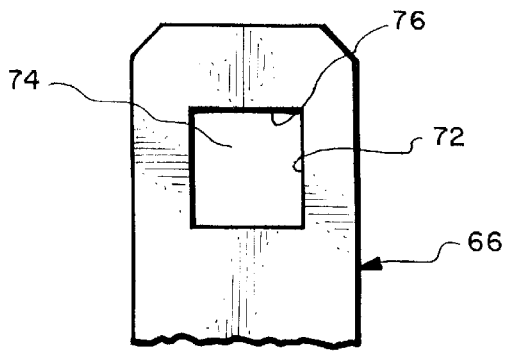
FIG. 10 is a fragmentary view of a tab constructed in accordance with the teachings of the invention.
Figure 11:
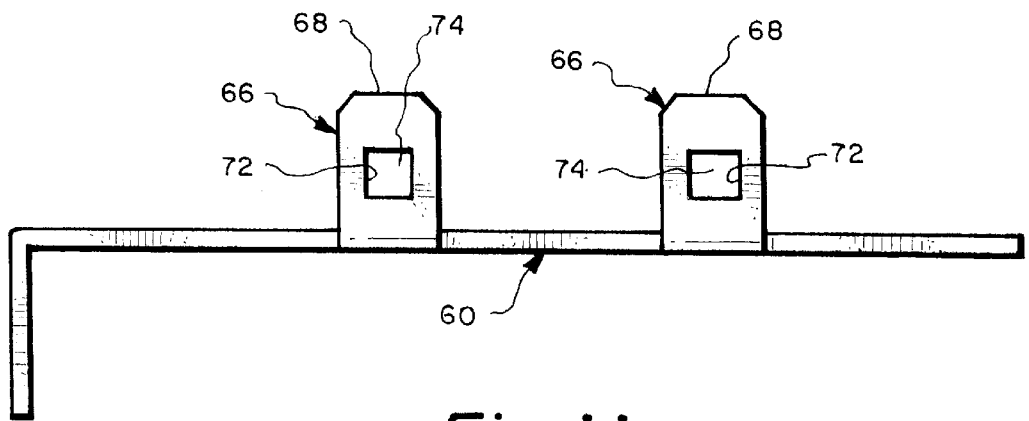
FIG. 11 shows a pair of tabs on a circuit board bracket.

After such locking occurs, the bracket 60 is maintained against displacement from the circuit board 64. The installation of the receptors 62 in operative relationship with the circuit board 64 is shown in FIGS. 7 and 9 of the drawings. The lower extremities of the bifurcated legs 86 are forced into the openings 108 of the circuit board and the retention projections 92 lock the receptors 62 in position on the circuit board 64.

Subsequently, the bifurcated legs 86 can be silver soldered or otherwise permanently affixed to the circuit board 102 if such subsequent affixation appears necessary.

The grounding function of the mount is accomplished by the spring tongue 106 of the latching means 104. When the spring tongue 106 engages the extremity 76 of the opening 74 constituting the detent means 72, a grounding circuit is established through the tabs 66 and the bracket 60.

By the utilization of the mount consisting of the bracket and receptors of my invention, the robotic assembly of the bracket in operative relationship with the board 40 can be accomplished, thus eliminating any manual assembly of any kind and permitting the utilization of the pick-and-place equipment presently utilized in depositing and securing board components on the circuit board.

It will, of course, be obvious to those skilled in the art that, as suggested above, the physical relationship which is the heart of the matter in the present circuit board mount can be achieved by equivalent means without departing from the scope of the invention.

I claim:

1. In a mount for a circuit board having top and bottom surfaces and opposite extremities, the combination of: a circuit board mounting bracket, said mounting bracket having an elongated shank with engagement means thereupon, said engagement means having detent means thereupon; and receptor means securable to one of said extremities, said receptor means incorporating a receptacle for slidable engagement by said engagement means, said receptor means having latch means engagable with said detent means of said engagement means to lock and position said engagement means in said receptacle.

2. The mount of claim 1 in which said engagement means is formed integrally with said shank.

3. The mount of claim 2 in which said shank engagement means is electrically conductive.

4. The mount of claim 1 in which said shank engagement means and receptor means are electrically conductive.

5. The mount of claim 4 in which said receptor means incorporates electrical contact means for ensuring electrical grounding of said circuit board through said engagement means and said shank.

6. The mount of claim 1 in which said detent means includes detents on said engagement means and said latch means are latching members on said receptor.

7. The mount of claim 1 in which said engagement means is a tab having opposite edges and said detent means are detents located in said edges, said latch means being latching members engagable with said detents.

8. The mount of claim 1 in which said engagement means is a tab having a detent opening therein and said latching means is a latching member engagable with said detent opening.

9. The mount of claim 1 in which said receptor means has a top wall, side walls, and legs depending therefrom engagable with said circuit board.

10. The mount of claim 9 in which said legs are for engaging openings in the circuit board.

11. The mount of claim 10 in which said legs have snap-in lower extremities to retain said receptor in operative relationship with the top surface of said circuit board and engagable with said bottom surface of said board to maintain said receptor on said board.

12. A mounting bracket for a circuit board, said bracket having an elongated shank with an engagement tab thereupon for slidable engagement with a circuit board receptor on said board, said engagement tab having detent means thereupon for engagement by latch means on said receptor.

13. In a mount for a circuit board having top and bottom surfaces, opposite extremities, and securement openings adjacent an extremity, the combination of:

a circuit board mounting bracket with an elongated shank having spaced tabs on said shank, the tabs having opposite edges and detents in said opposite edges; and receptors securable to said circuit board incorporating receptacles for slidable engagement by said tabs, said receptors having a top wall, legs engagable in said securement openings, and latches engagable with said detents to lock and position said tabs in said receptacles.

14. The mount of claim 13 in which said bracket and said receptors are electrically conductive to ground said board.

15. The mount of claim 13 in which said legs have snap-in lower extremities for extending through said securement openings and impinging on said bottom wall of said board to retain said receptors in operative relationship with the top surface of said board.

16. The mount of claim 13 in which the detents are openings in said tabs and said latches are formed in said top wall of said receptors for engagement with said detent openings.

* * * * *